United States Patent [19]
Smith

[11] Patent Number: 5,109,189
[45] Date of Patent: Apr. 28, 1992

[54] SINGLE CRYSTAL ELECTRO-OPTIC SENSOR WITH THREE-AXIS MEASUREMENT CAPABILITY

[75] Inventor: Malcolm Smith, Sudbury, Mass.

[73] Assignee: Geo-Centers, Inc., Newton Centre, Mass.

[21] Appl. No.: 485,968

[22] Filed: Feb. 27, 1990

[51] Int. Cl.$^5$ .................. G01R 19/00; G02F 1/03
[52] U.S. Cl. .................. 324/96; 324/158 R; 359/251
[58] Field of Search ............ 324/96, 158 R, 77 K; 350/374, 389, 390, 384, 387; 356/364, 365; 250/231.1

[56] References Cited

U.S. PATENT DOCUMENTS

| | | | |
|---|---|---|---|
| Re. 28,971 | 9/1976 | Kumada et al. | 350/150 |
| 2,768,557 | 10/1956 | Bond | 88/61 |
| 3,481,661 | 12/1969 | Harris | 350/150 |
| 3,536,375 | 10/1970 | Mansell | 350/157 |
| 3,838,906 | 10/1974 | Kumada | 350/389 |
| 4,269,483 | 5/1981 | Feldtkeller | 350/390 |
| 4,465,969 | 8/1984 | Tada et al. | 324/96 |
| 4,504,121 | 3/1985 | Carlsen et al. | 350/389 |
| 4,554,449 | 11/1985 | Taniuchi et al. | |
| 4,563,093 | 1/1986 | Tada et al. | 356/368 |
| 4,595,876 | 6/1986 | Kuhara et al. | 324/96 |
| 4,631,402 | 12/1986 | Nagatsuma et al. | 250/231 |
| 4,694,243 | 9/1987 | Miller et al. | 350/374 |
| 4,698,497 | 10/1987 | Miller et al. | 250/231 |
| 4,734,576 | 3/1988 | Agoston et al. | 250/225 |
| 4,784,473 | 11/1988 | Gookin | 350/389 |
| 4,919,522 | 4/1990 | Nelson | 350/389 |

FOREIGN PATENT DOCUMENTS 748654  12/1966  Canada .

OTHER PUBLICATIONS

"Non-Invasive Electro-Magnetic Field Sensor," Nelson et al., AFWAL-TR-86-3051 Final Report, AF Wright Aeronautical Laboratories, Jan. 1986.

"Electro-Optic Effect Of Zincblende," S. Namba, Journal of the Optical Society Of America, vol. 51, No. 1, pp. 148-151, Jan. 1961.

"A Fibre Optic Electric Field Sensor Using The Electrooptic Effect Of $Bi_4Ge_3O_{12}$," K. Shibata, published by IEE, given at the First International Conference on Optical Fiber Sensor, Apr. 26, 1983.

Primary Examiner—Kenneth A. Wieder
Assistant Examiner—Vinh P. Nguyen
Attorney, Agent, or Firm—Wolf, Greenfeld & Sacks

[57] ABSTRACT

A sensor utilizing a single electro-optic crystal for simultaneously measuring an electric field in three directions. By providing three light beams aligned along specific crystallographic directions and having specific polarizations, the crystal can simultaneously sense the electric field in three orthogonal directions. The crystal preferably has cubic symmetry and belongs to one of the point groups $\bar{4}3m$ or 23, such as crystals of bismuth silicon oxide or bismuth germanium oxide.

19 Claims, 5 Drawing Sheets

SINGLE CRYSTAL ELECTRO-OPTIC SENSOR WITH THREE-AXIS MEASUREMENT CAPABILITY

U.S. GOVERNMENT RIGHTS IN THE INVENTION

This invention was made by an employee of Geo-Centers, Inc. in the performance of work under Navy Contract No. N60921-88-C-0225 with Geo-Centers. The United States of America has certain rights in the invention arising out of that contract, as provided under Federal Acquisition Regulation 52.227-20.

FIELD OF THE INVENTION

This invention relates to a sensor utilizing an electro-optic crystal, and more particularly to a sensor utilizing a single electro-optic crystal for simultaneously measuring an electric field in three orthogonal directions.

BACKGROUND OF THE INVENTION

Electric field is a vector quantity and thus, at a given location in space, a complete determination of the electric field requires specifyinq the direction of the field as well as its magnitude. If the direction of the field is known, a single-axis electric field sensor can be placed with its sensitive direction aligned with the field. However, if the direction of the field is unknown, measurement of the field along all three orthogonal axes (x, y and z) is necessary for a determination of field direction as well as magnitude.

A conventional method for making a complete electric field measurement is to use three single crystal single axis sensors aligned along the three independent spacial directions. Alternatively, Nelson, B., Menzel, C. and DiGuisseppe, T., "Non-Invasive Electro-Magnetic Field Sensor," AFWA-TR-86-3051, Final Report, AF Wright Aeronautical Laboratories, January 1986, describes a single crystal two axis sensor for simultaneously measuring the electric field in two directions. It is suggested that two of these two axis crystals may be aligned in orthogonal directions to enable simultaneous measurement of the electric field in three directions.

The sensor described in Nelson et al. utilizes an electro optic crystal of bismuth germanium oxide $Bi_4(GeO_4)_3$ (hereinafter BGO). Fiber optic single axis sensors of BGO are described in K. Shibata, "A Fibre Optic Electric Field Sensor Using The ElectroOptic Effect Of $Bi_4Ge_3O_{12}$," published by IEE, given at the First International Conference On Optical Fiber Sensors, Apr. 26, 1983, and in U.S. Pat. No. 4,631,402 to Nagatsuma et al.

The present invention improves upon the known methods for measuring electric fields by making three axis sensing possible with a single electro-optic crystal. Using the apparatus and method described herein, a measurement of the vector electric field (both direction and magnitude) can be carried out with a single sensing element.

SUMMARY OF THE INVENTION

In accordance with this invention there is provided an apparatus and method for determining the direction and magnitude of an electric field incident to a single electro-optic crystal. The technology has various applications, for example, electric field sensing, voltage sensing, optical switching or modulation, or lightning detection.

The crystal preferably has cubic symmetry and belongs to one of the point groups $\bar{4}3m$ or 23, such as crystals made of bismuth germanium oxide ($Bi_{12}GeO_{20}$, $Bi_4Ge_3O_{12}$), or bismuth silicon oxide ($B_{12}SiO_{20}$, $Bi_4Si_3O_{12}$). In a preferred embodiment, a $Bi_4(GeO_4)_3$ (BGO) crystal of point group $\bar{4}3m$ is provided as a rectangular parallelepiped having crystal faces lying in the $<110>$, $<\bar{1}10>$ and $<001>$ directions. Three separately polarized optical beams are passed through the crystal to measure the electric-field induced birefringence resulting from fields applied in three orthogonal directions. Preferably, all three beams lie in one plane, which enables the use of a small volume sensor having a reduced profile (i.e., small height). A crystal so constructed has been found to be sensitive to electric fields along three orthogonal directions with substantially no cross talk between channels.

DETAILED DESCRIPTION OF THE PREFERRED EMBODIMENTS

According to the apparatus and method of this invention, a single electro optic crystal is utilized for making a complete measurement of the electric field. By providing three light beams aligned along specific crystallographic directions and having specific polarizations, the crystal can simultaneously sense the electric field in three orthogonal directions.

The crystal utilized in this invention preferably has cubic symmetry and belongs to one of the point groups $\bar{4}3m$ or 23. These crystals exhibit neither natural birefringence nor pyroelectricity and thus are not temperature sensitive. The point group $\bar{4}3m$ crystal is preferred because it further exhibits no optical activity. Suitable crystals of point group 23 are $Bi_{12}SiO_{20}$ or $Bi_{12}GeO_{20}$. Suitable crystals of point group $\bar{4}3m$ are $Bi_4Ge_3O_{12}$ (BGO) or $Bi_4Si_3O_{12}$ (BSO). BGO is particularly preferred because of its relatively small dielectric constant (i.e., 16), which reduces the disturbance of the electric field being measured by the sensor.

Figure 5:
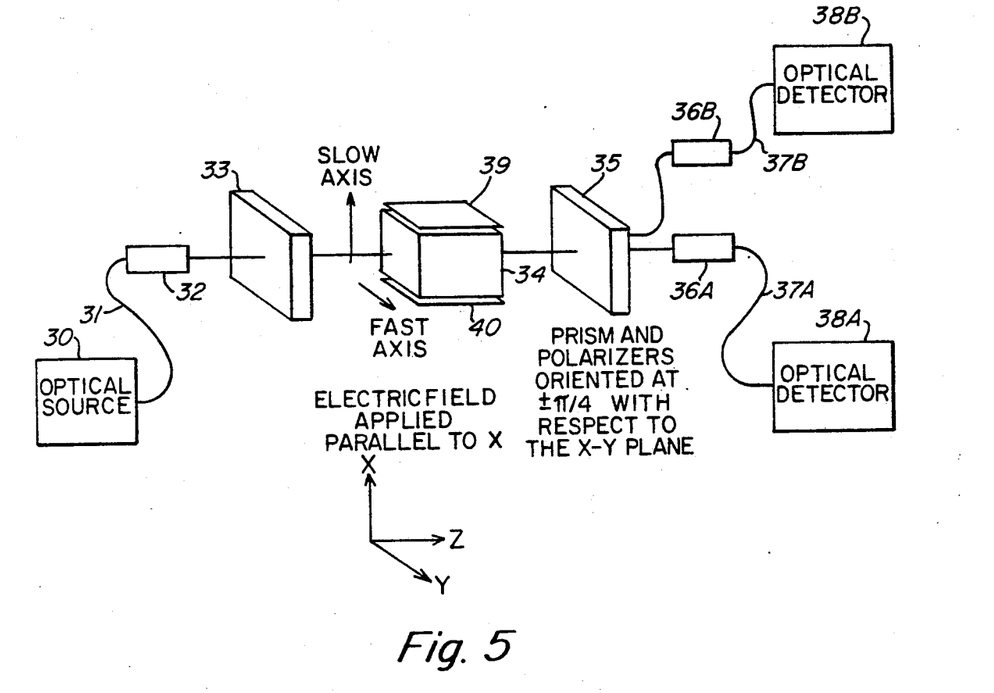
FIG. 5 is a schematic diagram of a sensor apparatus utilizing the BGO crystal according to this invention.

In general, application of an electric field to an electro optic crystal results in a change in refractive index along certain crystal directions. In certain electro optic crystals, such as BGO, when an electric field is applied along a specific crystallographic direction, the resultant refractive indices are different for orthogonal directions in the crystal. Thus, as shown in FIG. 5, if light is initially polarized at $\pi/4$ with respect to these different refractive index directions (fast and slow axes), then a phase shift will occur between the two components of the polarized light that lie along the fast and slow axes of the crystal as the light propagates through the crystal. This phase shift is proportional to the applied electric field strength and is referred to as electric field induced birefringence.

Figure 1:
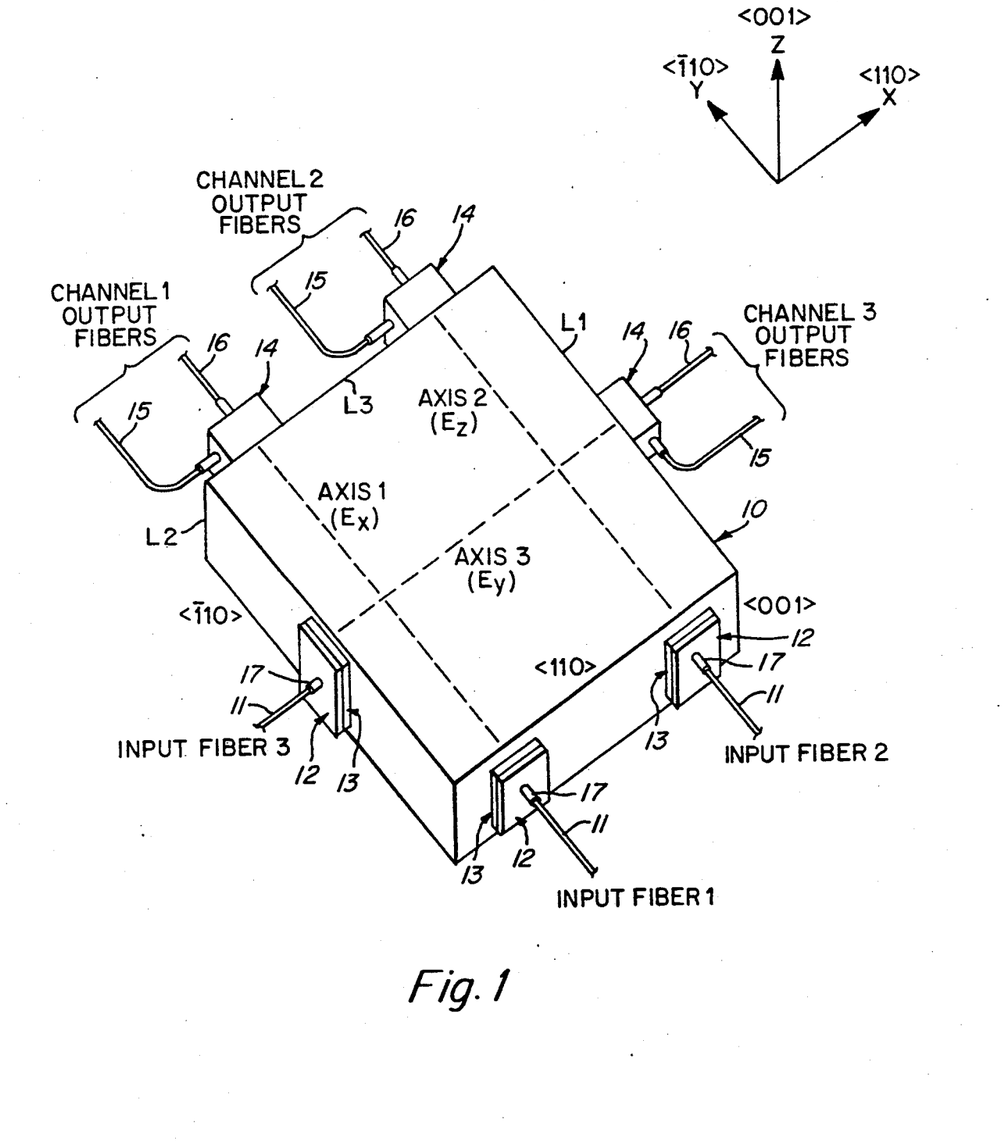
FIG. 1 is an enlarged schematic diagram of a preferred embodiment of the triple axis sensor of this invention which utilizes a single BGO crystal for simultaneous sensing in three orthogonal directions.
Figure 1A:
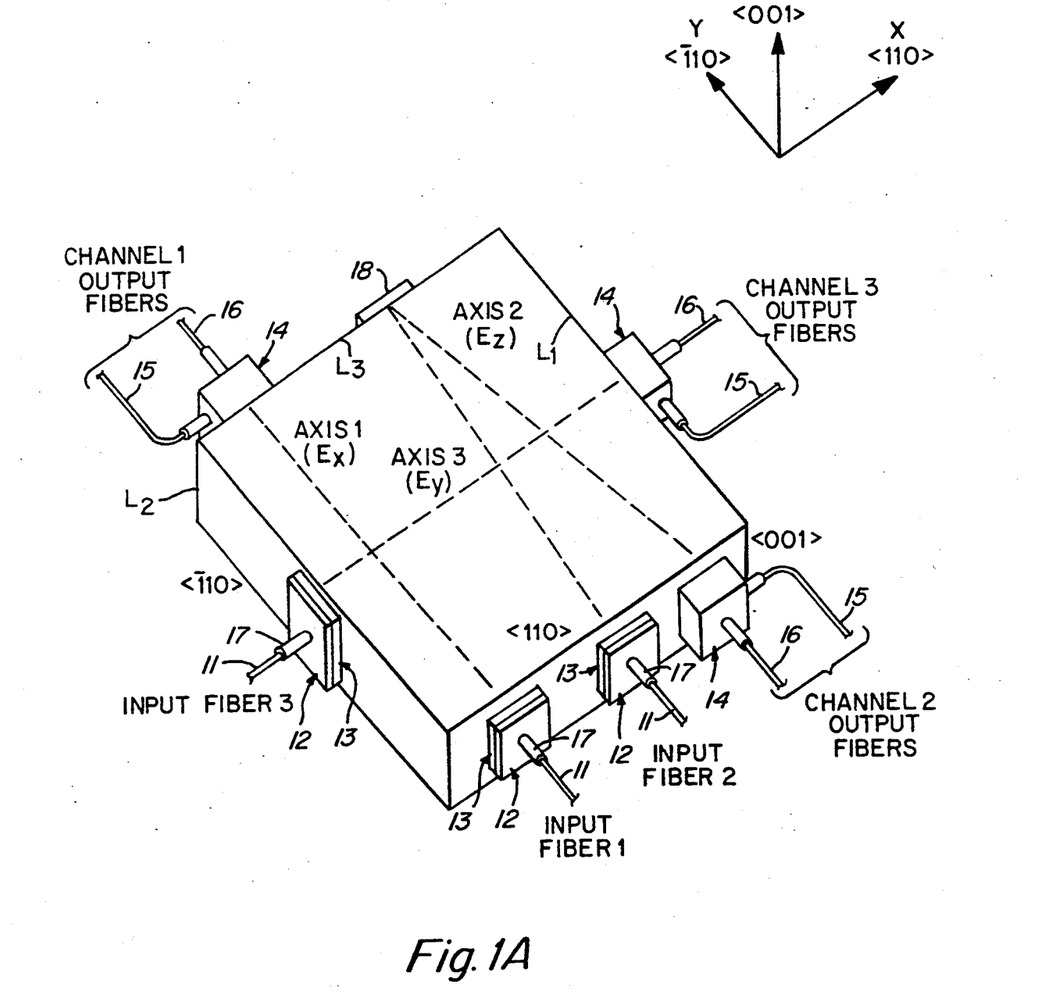
FIG. 1A is an enlarged schematic diagram of an alternative embodiment of the triple-axis sensor of this invention which the path length of the axis 2 is double.

In a preferred embodiment shown in FIG. 1, three light beams all parallel to the [001] plane are passed through a BGO crystal 10. The shape of the crystal is that of a rectangular parallelepiped having two sides $L_1$, $L_3$ of equal length lying in the $<110>$ and $<\bar{1}10>$ directions and a third side $L_2$ lying in the $<001>$ direction of substantially lesser length, resulting in a flat square. The height of the crystal, as determined by the third side $L_2$, is independent of the dimensions of the square. All of the optical components are mounted on the third sides parallel to the $<001>$ direction (side $L_2$ and the side parallel thereto).

Alternatively, a sensing scheme is possible in which three light beams pass through the crystal in three perpendicular directions. In this alternative embodiment, the crystal is cut with edges parallel to the $<001>$, $<010>$ and $<100>$ directions. Three beams are passed through the crystal in the $<001>$, $<010>$, and $<100>$ directions. The analyzers are oriented parallel to the edges of the crystal on each face, e.g., for the beam in the $<001>$ direction, the output polarizers are oriented parallel to the $<010>$ and $<100>$ directions. However, this alternative embodiment is less desirable because optical components must be mounted on all six faces of the crystal. Furthermore, the use of three perpendicular beams necessitates the use of a cubic shaped crystal, and thus a large volume if any significant length of beam path is used. Thus, in the preferred embodiment shown herein, where all three beams are parallel to a single plane, the mounting of the components and the making of the sensor are considerably easier, and the volume of the electro optic crystal is reduced. Additionally, the configuration allows for a very low profile (small height) three axis electric field sensor.

As shown in FIG. 1, the three beam axes lie in the X-Y plane, where X corresponds to the $<110>$ direction, Y to the $<\bar{1}10>$ direction and Z to the $<001>$ direction. Axis 1 lies in the Y direction and is used to measure the electric field in the X direction ($E_x$). Axis 2 also lies in the Y direction, being spaced from axis 1, and is used to measure the electric field in the Z direction ($E_z$). Axis 3 lies perpendicular to axes 1 and 2, lying in the X direction, and is used to measure the electric field in the Y direction ($E_y$). Each axis is defined between, on the input side, an input optical fiber 11, a collimating lens (such as a grin rod or spherical lens) 17, a polarizer 12 and a quarter wave plate 13 in serial arrangement, and on the output side, a polarizing beam splitter or analyzer 14 and two output fibers 15, 16.

Light for each axis is transmitted to the crystal on optical fiber 11. A source of light (not shown) preferably emits light at one wavelength (i.e., a laser) which is collimated by lens 17. The collimated light is subsequently circularly polarized by using the combination of a linear polarizer 12 and a quarter wave plate 13 oriented with its fast and slow axis at 45° with respect to the linear polarizer. After passing through the crystal, the light beam for each axis passes through polarizing beam splitter 14, which separates light of orthogonal polarizations.

The effect of utilizing a circularly polarized beam may be seen by first considering an optical configuration such as that in FIG. 5, but with the input quarter wave plate removed from polarizer 33. For this case, collimated light from an optical source 30 passes through optical fiber 31, grin-rod lens 32, and an input polarizer which is oriented at $\pi/4$ with respect to the X-Y plane. When an electric field is applied parallel to the X axis, a phase shift occurs between the components of light along the X and Y axes (birefringence). The index of refraction increases along the X direction, while the index of refraction along the Y direction remains constant. A beam polarized along the X axis propagates at a slower speed than a beam which is polarized along the Y axis. Consequently, the X axis is known as the slow axis and the Y axis as the fast axis. This induced birefringence causes the light which exits the crystal 34 and is nominally linearly polarized at $\pi/4$ with respect to the X-Y plane, to become elliptically polarized, then circularly polarized, then elliptically polarized, and finally linearly polarized at $-\pi/4$ with respect to the X-Y plane, as the applied E field increases. Because of this, two different orientations for the output analyzer 35 are of interest, these being $+\pi/4$ and $-\pi/4$ with respect to the X-Y plane. The output of analyzer 35 is sent on fibers 37A, 37B to collimating lenses 36A, 36B and optical detectors 38A, 38B.

The optical intensity that reaches the detectors 38A, 38B exhibits a sine squared relationship as a function of the applied electric field. The optical power transmitted into the two polarization directions of interest are out of phase with each other by $\pi/2$. With an analyzer oriented at $-\pi/4$ with respect to the X-Y plane, the transmitted optical intensity with zero applied electric field is nominally zero. When an input quarter wave plate is added to the optical configuration, the transmitted optical intensity with zero applied electric field moves to the inflection point of the sine squared relationship between the transmitted intensity and the applied electric field. This results in maximum sensor linearity, and is referred to as optical biasing.

Figure 2A:
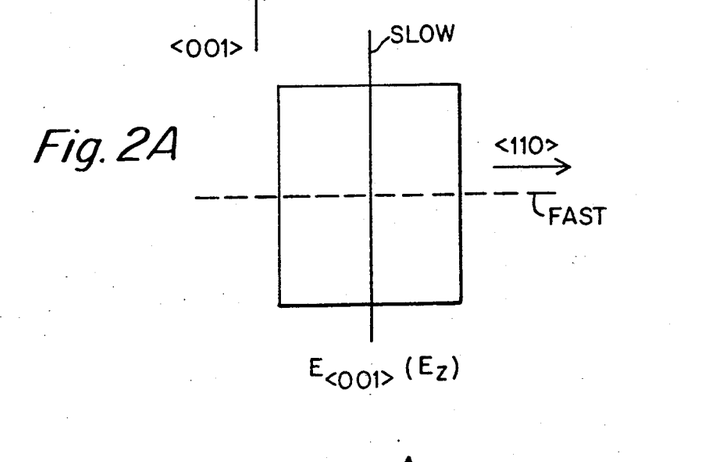
FIGS. 2A, 2B and 2C diagramatically show the orientation of the three sets of fast and slow axes in the BGO crystal utilized according to this invention.
Figure 2B:
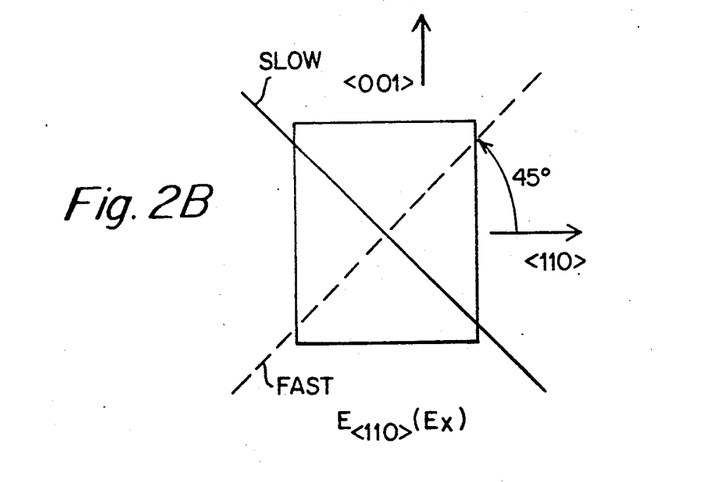
Figure 2C:
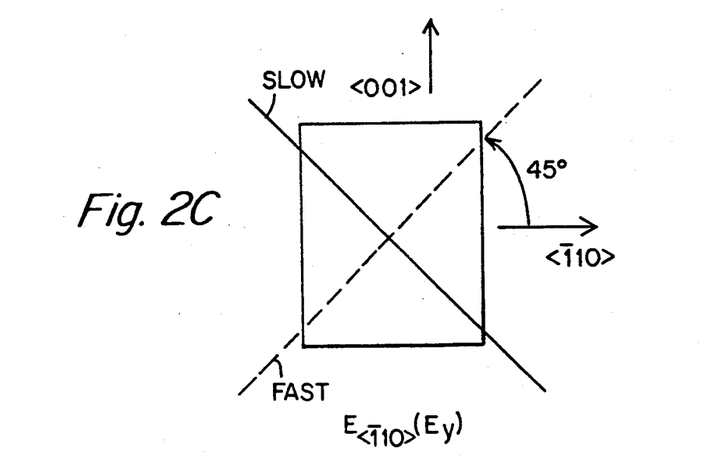

In the preferred embodiment of this invention shown in FIG. 1, the orientations of the output polarizers 14 for the three axes are determined by the directions of the induced fast and slow axes of birefringence in the crystal. The three sets of fast and slow axes for the preferred embodiment described herein are shown in FIGS. 2A, 2B and 2C for the electric field components $E_z$, $E_x$ and $E_y$, respectively.

The directions of the fast and slow axes can be determined from the index ellipsoid, an elliptical surface whose three major axes are related to the indices of refraction of the electro-optic crystal. Given the electric field direction and the optical beam direction, an eigenvalue equation utilizing the index ellipsoid is solved which gives the magnitude of the induced birefringence (eigenvalues) and the directions of the fast and slow axes (eigenvectors). The output polarizers must be oriented at 45° to the fast and slow axes to measure the induced birefringence.

In the case where the optical beam is at 45° to two crystallographic directions, and the electric field is perpendicular to the beam and also at 45° to two crystallographic directions, the fast and slow axes are oriented at ±45° to the field direction, and thus the output polarizers must be oriented at 0° and 90° to the field direction. This case corresponds to the measurements of $E_x$ and $E_y$ as shown in FIGS. 2B-2C.

If the beam is in the same direction as above, and the field is perpendicular to it but now points along one of the crystallographic directions, the fast and slow axes are oriented at 0° and 90° to the field direction, and the output polarizers are placed at ±45° to the field direction. This corresponds to the measurement of $E_z$ as shown in FIG. 2A.

The magnitude of the electric field along each axis is determined by measuring the intensities of the two polarizations of light at each beam splitter. From these intensities, the phase retardation induced in the orthogonal polarization components of the light beam by the electric field is determined. For each axis, the induced phase retardation or birefringence $\Gamma$ is given by:

$$\Gamma_1 = (2\pi L_1/\lambda) r_{41} n_0^3 E_x$$

$$\Gamma_2 = (\pi L_1/\lambda) r_{41} n_0^3 E_z$$

$$\Gamma_3 = (2\pi L_3/\lambda) r_{41} n_0^3 E_y$$

where $\Gamma_1$, $\Gamma_2$, $\Gamma_3$ are the phase retardations for axes 1, 2, and 3, respectively, $L_1$ and $L_3$ are the optical path lengths of the beams (corresponding to the crystal dimensions for a single pass configuration), $\lambda$ is wave length, $r_{41}$ is the electro-optic constant, $n_0$ is the zero-field refractive index, and $E_x$, $E_y$, and $E_z$ are the components of electric field. BGO has a broad transmission ban which includes all visible and near infrared optical wavelengths; any wavelength within the band may be selected. For example, a wavelength of 830 nm is suitable for which there are widely available light sources and detectors. The values of $r_{41}$ and $n_0$ depend on the wavelength and are disclosed in I. P. Kaminov and E. H. Turner, "Handbook Of Lasers," R. J. Pressley, pp. 447-459 (1971), published by Chemical Rubber Co., Cleveland, Ohio.

The sensitivity of measurement is not the same for the three axes—the sensitivity of $E_z$ being one-half that for the other two axes. This difference can be remedied by the use of a mirror, 18 (as shown in FIG. 1) which reflects the light along axis 2 back through the crystal, doubling the path length, $L_1$. By this technique, the sensitivity of $E_z$ can be made equal to that of the other two axes. Alternatively, the smaller sensitivity of axis 2 can be compensated for by providing a sensor interface that compensates for these different sensitivities with software, hardware, or by analyzing the data collected on three separate channels.

To measure the induced birefringence $\Gamma$ for each optical axis, two detectors are incorporated at the end of optical fibers 15 and 16 so as to measure the intensities $I_1$, $I_2$ of the two polarization components of each beam. The two intensities are $$I_1 = I_0 \sin^2 (\Gamma/2 - \pi/4)$$

$$I_2 = I_0 \sin^2 (\Gamma/2 + \pi/4)$$

where $I_0$ is the intensity of the initial (unsplit) beam. The difference to sum ratio of these two intensities is:

$$(I_1 - I_2)/(I_1 + I_2) = \sin \Gamma \sim \Gamma$$

The approximation to $\Gamma$ holds if the phase retardation $\Gamma$ is small compared to 1 (i.e., $-0.6 < \Gamma < +0.6$). Thus, the difference-to sum ratio is the induced birefringence $\Gamma$.

The difference-sum output is intensity invariant, making this the preferred detection scheme for operating a fiber optic electric field sensor in environments where fiber darkening might occur, or where input light intensity variations are anticipated. It is also useful for the measurement of very small electric fields. This is because intensity noise associated with the optical source is reduced with this output detection scheme. Other methods may be used to determine the electic field component sensed by each of the three optical beams.

Another advantage of this preferred embodiment is that the sensitivity of the field measurement does not depend upon the height of the crystal. The sensitivity of the measurement can be increased by increasing the lengths of the sides $L_1$ and $L_3$ lying in the $<\bar{1}10>$ and $<110>$ directions. The height $L_2$ (in the $<001>$ direction), which is only determined by the necessity of being somewhat larger than the diameter of the optical beam, need not change.

In a laboratory experiment, a $30 \times 30 \times 5$ mm crystal of bismuth germinate (BGO) was placed between electric field generating plates 39, 40 (see FIG. 5) which could be tilted at different angles. Beams of light were passed through the crystal and the induced birefringence was measured on three optical axes as described herein. The three optical axes were sensitive to electric field in the manner described, and no crosstalk between channels (e.g., sensitivity of axis 1 to fields sensed by axes 2 or 3, for instance) was observed.

The orientation of the beams and output polarizers for simultaneous three-axis sensing was determined as follows by solving the index ellipse. Derivation of the index ellipse for another crystal class is described in S. Namba, "Electro-Optical Effect Of Zincblende," J. Optical Society Of America, Vol. 51, No. 1, 148-151 (1961).

The electro-optic effect is a well understood phenomenon in which the indices of refraction of an electro optic crystal change when an electric field is applied. The resulting indices of refraction can be described by the index ellipse or indicatrix represented by the following equation:

$$\sum_{ijk} [(1/n_{ij}^2) + (r_{ijk} E_k)] x_i x_j = .1 \tag{1}$$

where:
$r_{ijk}$ = the electro optic coefficients which are specific to a given electro-optic crystal
$x_i$, $x_j$ = the polarization directions of the light propagating in the crystal (perpendicular to the direction of light propagation)
$n_{ij}$ = the index of refraction along a given crystal direction (only valid for $i = j$)
$E_k$ = the electric field applied in the k direction Equation (1) is the equation of an ellipsoid whose ellipticity changes as a function of applied electric field. For light propagating along a given crystal direction, the eigenvalues of Equation (1) are evaluated on the plane perpendicular to the direction of light propagation in order to determine the indices of refraction for the two normal modes of propagation. If these two eigenvalues differ, then the speed of light polarized along one eigenvector will be different than the speed of light polarized in the orthogonal direction, and the relative phase difference between these polarizations will change during the transit of the crystal. The induced birefringence with applied electric field can be calculated from this change in phase.

The induced birefringence is found to be:

$$\Gamma_{in} = \Gamma_{tot} - \Gamma_{nat} = L[(k_i - k_j) - (k_{oi} - k_{oj})] \quad (2)$$

where:
$\Gamma_{in}$ = electric field induced birefringence
$\Gamma_{nat}$ = natural birefringence
$\Gamma_{tot}$ = total birefringence
L = crystal length
$k_{oi}, k_{oj}$ = the wave number of the normal modes of propagation
$k_i, k_j$ = the wave number of the normal modes of propagation with applied field Substituting $k = 2\pi n/\lambda$ into equation (2):

$$\Gamma_{in} = 2\pi L/\lambda[(n_i - n_j) - (n_{oi} - n_{oj})] = 2\pi/\lambda (\Delta n_i - \Delta n_j) \quad (3)$$

where:
$n_{oi}, n_{oj}$ = indices of refraction of the normal modes of propagation
$n_i, n_j$ = indices of refraction of the normal modes of propagation with applied field
$\lambda$ = wavelength of incident light
$\Delta n_i$ is the change in index of refraction in the i direction with applied electric field. Using:

$$\partial/\partial n(1/n_i^2) = (-2/n_{oi}^3) dn_i \quad (4)$$

and approximating that $dn = \Delta n$, we find:

$$\Delta n_i = (-n_{oi}^3/2)\Delta(1/n_i^2) \quad (5)$$

$$\Gamma_{in} = (\pi L/\lambda)[n_{oi}^3 \Delta(1/n_i^2) - n_{oj}^3 \Delta(1/n_j^2)] \quad (6)$$

The $n_i$ and $n_j$ terms are often dependent on the electro-optic coefficients $r_{ijk}$. Relationships between these coefficients are determined by a crystal's lattice type and point group symmetry. All cubic $\overline{4}3$ m lattices have an $r_{ijk}$ matrix of the form:

$$\begin{bmatrix} 0 & 0 & 0 \\ 0 & 0 & 0 \\ 0 & 0 & 0 \\ r_{41} & 0 & 0 \\ 0 & r_{52} & 0 \\ 0 & 0 & r_{63} \end{bmatrix} \quad (7)$$

$r_{41} = r_{52} = r_{63}$ where a contracted notation has been used:

i,j $\longrightarrow$ m 1,1 $\longrightarrow$ 1

2,2 $\longrightarrow$ 2

3,3 $\longrightarrow$ 3

2,3 $\longrightarrow$ 4

1,3 $\longrightarrow$ 5

1,2 $\longrightarrow$ 6

Equation (1) can be used to calculate $n_i$ and $n_j$, and, therefore, $\Delta n_i$ and $\Delta n_j$, for the normal modes of the crystal. This is done in order to calculate $\Gamma_{in}$ in an electro optic crystal.

Figure 3:
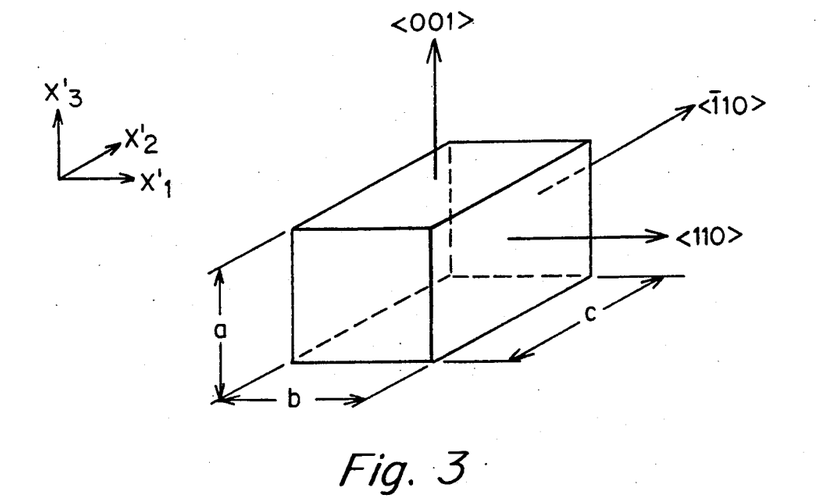
FIG. 3 is a schematic diagram of the orientation of the BGO crystal used in this invention.

Now to apply this theory to a BGO crystal. This crystal has $\overline{4}3$ m symmetry and has been cut into a rectangle with edges <110>, <$\overline{1}$10>, and <001> as shown in FIG. 3. This crystal orientation is chosen because it leads to a transverse effect that is both large and simple to test experimentally. The indicatrix for a BGO crystal with $\overline{4}3$ m lattice is found from equations (1) and (7) (using the contracted notation):

$$1 = (1/n_o^2)(x_1^2 + x_2^2 + x_3^2) + 2r_{41}(E_1 x_2 x_3 + E_2 x_1 x_3 + E_3 x_1 x_2) \quad (8)$$

where:
$n_o^2 = n_{o1}^2 = n_{o2}^2 = n_{o3}^2$ as BGO is an isotropic crystal.

Figure 4:
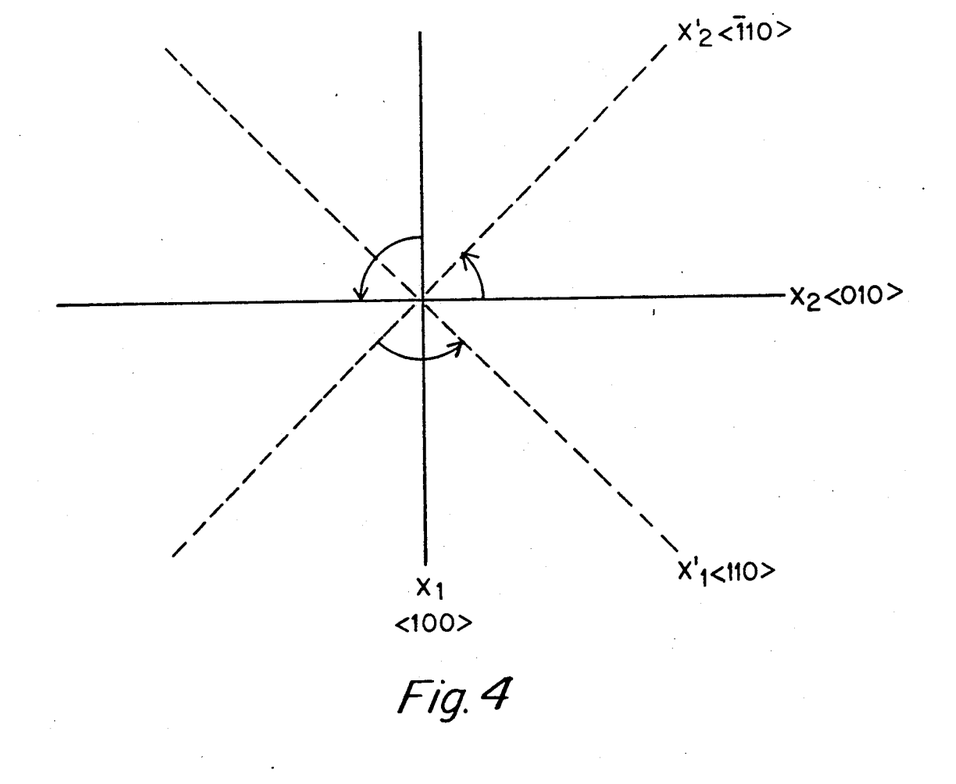
FIG. 4 is a schematic diagram of the $\pi/4$ rotation about the $<001>$ direction to achieve the new coordinate directions ($x_1'$, $x_2'$, $x_3'$) for the crystal orientation of FIG. 3.

Rotating coordinates $\pi/4$, as shown in FIG. 4, about the <001> in equation (8) yields:

$$1 = (1/n_o^2)(x_1'^2 + x_2'^2 + x_3'^2) + (2r_{41}/\sqrt{2})[A_1(E_1' - E_2')(x_1' x_3' - x_2' x_3') + A_2(E_1' + E_2')(x_1' x_3' + x_2' x_3')] + r_{41} E_3'(x_1'^2 - x_2'^2) \quad (9)$$

where:

$A_1 = E_1/|\vec{E}_{tot}|$   $x_1 = (1/\sqrt{2})(x_1' - x_2')$ $A_2 = E_2/|\vec{E}_{tot}|$   $x_2 = (1/\sqrt{2})(x_1' + x_2')$ $E_3 = E_3'$   $x_3 = x_3'$ and the prime indicates the new coordinate directions.

Where light is propagating in the <e,ovs/1/ 10> direction, no light can be polarized along that direction, which is to say that $x_2'$ is zero. Writing equation (9) in matrix form and eliminating the $x_2'$ terms yields:

$$0 = \begin{vmatrix} \dfrac{1}{n_o^2} + r_{41} E_3' & \dfrac{r_{41}}{\sqrt{2}}[A_1(E_1' + E_2') + A_2(E_1' - E_2')] \\ \dfrac{r_{41}}{\sqrt{2}}[A_1(E_1' + E_2') + A_2(E_1' - E_2')] & \dfrac{1}{n_o^2} \end{vmatrix} \quad (10)$$

Diagonalizing the above matrix to determine the eigenvalues $\gamma$ produces:

$$\gamma = 2a + \sqrt{2} M E_3' \pm [(2a + \sqrt{2} M E_3')^2 - 4(a^2 + 2\sqrt{2} M E_3' - M(A_1 \epsilon_+ + A_2 \epsilon_-))]^{\frac{1}{2}} \quad (11)$$

where:
$a = 1/n^2$ $M = r_{41}/\sqrt{2}$ $\epsilon + = (E_1' + E_2')$ $\epsilon - = (E_1' - E_2')$ The induced birefringence with applied electric field is now calculated for electric fields applied along each of the $<110>$, $<\bar{1}10>$ and $<001>$ crystal directions.

For E applied along $<110>$ ($x_1'$ direction), equations (10) and (11) yield the following eigenvalues:

$$1/n^2 = (1/n_o^2) \pm r_{41} |\vec{E_x}| \qquad (12)$$

The eignvectors for this case are oriented at $+\pi/4$ and $-\pi/4$ with respect to the $<001>$ crystal direction. The relative index of refraction change between these two axes is therefore:

$$\Delta(1/n_2) = 1/n^2 - 1/n_o^2 = 2r_{41}|\vec{E_x}| \qquad (13)$$

Substituting equation (13) into equation (6) yields:

$$\Gamma_{in} = (2\pi/\lambda)n_o^3 \, r_{41} L E_x \qquad (14)$$

For E applied along $<001>$ ($x_3'$ direction) equations (10) and (11) yield the following eigenvalues:

$$1/n^2 = (1/n_o^2) + r_{41}|\vec{E_z}| \text{ and } 1/n^2 = 1/n_o^2 \qquad (15)$$

The eigenvectors for this case are oriented at 90° and 0° with respect to the $<001>$ crystal direction. The relative index of refraction change between these two axes is therefore:

$$\Delta(1/n^2) = \pm r_{41}|\vec{E_z}| \qquad (16)$$

Substituting equation (16) into equation (6) yields:

$$\Gamma_{in} = (\pi/\lambda) n_o^3 \, r_{41} L E_z \qquad (17)$$

For E applied along $<\bar{1}10>$ direction ($x_2'$ direction), crystal symmetry properties are utilized. This case is analogous to E applied along $<110>$, and the eigenvalues are:

$$1/n^2 = (1/n_o^2) \pm r_{41}|\vec{E_y}| \qquad (18)$$

The eignvectors for this case are oriented at $+\pi/4$ and $-\pi/4$ with respect to the $<001>$ crystal direction. The relative index of refraction change between these two axes is therefore:

$$\Delta(1/n_2) = 1/n^2 - 1/n_o^2 = 2r_{41}|\vec{E_y}| \qquad (19)$$

Substituting equation (13) into equation (6) yields:

$$\Gamma_{in} = (2\pi/\lambda) n_o^3 \, r_{41} L E_y \qquad (20)$$

The apparatus of this invention has many applications, in addition to its use as an electric field sensor. In another embodiment, the apparatus can be used for electro-optically measuring a voltage. For example, by applying electrodes to opposing faces of the crystal (see for example plates 39, 40 in FIG. 5), a potential difference applied to these electrodes will produce an electric field which in turn will produce a phase shift between the two orthogonal components of a polarized light beam passing through the crystal. The phase shift between these two components of the emergent beam, which is proportional to the strength of the electric field and the length of the crystal, and can be used to determine the magnitude of the applied voltage.

Still further, by employing an electric field of suitable strength (e.g., by varying the voltage) and cutting the crystal to the requisite length, the plane of polarization of the emergent beam can be rotated by any desired amount relative to the plane of polarization of the incident beam. This effect can be utilized to employ the sensor as an optical switch or optical modulator. Thus, the output polarizer can be oriented to permit the emergent beam to pass through the output polarizer when an electric field is established between the electrodes, and to block passage of the emergent beam in the absence of an electric field. Alternatively, the output polarizer can be oriented to block the passage of the emergent beam when an electric field is established between the electrode plates and to pass the emergent beam in the absence of an electric field. In either orientation, the arrangement can be utilized as a light shutter, with one orientation acting as a normally open shutter and the other orientation acting as a normally closed shutter. Between those two extremes, the orientation of the output polarizer can be selected to allow a predetermined amount of light to pass through for a predetermined applied voltage, and thus function as a modulator.

Thus, the invention may be used in an optical switch or modulator such as that described in the following references, which are hereby incorporated by reference: copending and commonly-owned Ser. No. 07/160,126, now U.S. Pat. No. 4,919,522 filed Feb. 25, 1988, by Nelson entitled "Optical Switch Having Birefringent Element"; "Electro-Optic Effect Of Zincblende," S. Namba, Journal of the Optical Society of America, Vol. 51, No. 1, pages 148-151, January 1961; and U.S. Re. Pat. No. 28,971 to Kumada et al., which issued Sept. 21, 1976, entitled "Light Modulator Element."

The invention may also be utilized in a voltage measuring device such as that described in the following references, which are hereby incorporated by reference: U.S. Pat. No. 4,269,483 to Feldtkeller which issued May 26, 1981, entitled "Electro-Optical Voltage Measurement Device"; U.S. Pat. No. 4,465,969 to Tada et al. which issued Aug. 14, 1984, entitled "Voltage And Electric Field Measuring Device Using Light"; and U.S. Pat. No. 4,563,093 to Tada et al. which issued Jan. 7, 1986, entitled "Voltage And Electric Field Measuring Device Using Light."

Still further, the invention may be utilized in a lightning detector such as that described in the following reference, which is hereby incorporated by reference: "Non-Invasive Electro-Magnetic Field Sensor," Nelson et al., AFWAL-TR-86-3051, Final Report, AF Wright Aeronautical Laboratories, January 1986.

Although certain preferred embodiments of the invention have hereinbefore been described, it will be appreciated that variations of the invention will be perceived by those skilled in the art, which variations are nevertheless within the scope of the invention as defined by the claims appended hereto.

I claim:

1. An electro-optic sensor comprising:
   a single electro-optic crystal;
   said crystal including three optical paths to enable detection of three orthogonal components of an applied electric field;

input polarizing means for providing three separately polarized beams, one along each of the three paths, wherein at least two of the beam are oriented along different crystallographic directions; and output polarizing means for each of the three paths, each of the output polarizing means receiving the associated beam after it traverses the path and being oriented with respect to the associated input polarizing means so as to be sensitive to birefringence induced by one or more of the three orthogonal components of the applied electric field.

2. The sensor of claim 1, wherein the crystal is of cubic symmetry and point group $\bar{4}3$ m or 23.

3. The sensor of claim 2, wherein the crystal is a rectangular parallelepiped having sides oriented in the $<110>$, $<\bar{1}10>$ and $<001>$ directions.

4. The sensor of claim 3, wherein all three beams lie in one plane.

5. The sensor of claim 4, wherein all three beams lie in the plane, a first path lies along the $<\bar{1}10>$ direction, a second path lies along the $<110>$ direction, and a third path lies along either of the $<\bar{1}10>$ or $<110>$ directions.

6. The sensor of claim 5, wherein the length of the crystal side oriented in the $<001>$ direction is substantially less than the lengths of the crystal sides oriented in the $<110>$ and $<\bar{1}10>$ directions.

7. The sensor of claim 4, wherein all of the output polarizing means are mounted on parallel sides of the crystal which are perpendicular to the plane of the beams.

8. The sensor of claim 1 adapted for measuring an electric field, further comprising means for detecting the phase shift between two orthogonal components of each polarized beam due to the crystal birefringence.

9. The sensor of claim 1 adapted for measuring a voltage, further comprising means for applying a voltage across the crystal, wherein the applied voltage produces the applied electric field, and means for detecting the phase shift between two orthogonal components of each polarized beam due to the crystal birefringence.

10. The sensor of claim 1 adapted for use as an optical switch or modulator, wherein the output polarizing means are oriented to permit from zero to a predetermined amount of the beam to pass through the output polarizing means in response to an applied electric field.

11. The sensor of claim 10, further comprising means for applying a voltage across the crystal, wherein the applied voltage produces the applied electric field.

12. An electro optic sensor comprising:
a single electro optic crystal of cubic symmetry and point group $\bar{4}3$ m or 23;
the crystal being a rectangular parallelepiped having sides oriented in the $<110>$, $<\bar{1}10>$ and $<001>$ directions, the sides lying in the $<110>$ and $<\bar{1}10>$ directions being of substantially equal length;
means for directing a substantially circularly polarized first beam down a first path oriented in the $<\bar{1}10>$ direction;
means for directing a substantially circularly polarized second beam down a second path oriented in the $<110>$ direction;
means for directing a substantially circularly polarized third beam down a third path oriented in the $<\bar{1}10>$ or $<110>$ directions and spaced apart from either the first or second paths respectively;

means for measuring the intensities of the beam exiting the first path at polarizations of 0° and 90° to the $<001>$ direction;
means for measuring the intensities of the beam exiting the second path at polarizations of 0° and 90° to the $<001>$ direction; and
means for measuring the intensities of the beam exiting the third path at polarizations of ±45° and 45° to the $<001>$ direction;
wherein the magnitudes of the three components of the electric field in the $<110>$, $<\bar{1}10>$ and $<001>$ directions are determined from the intensities of the two polarizations measured at the end of each of the first, second and third paths respectively.

13. The sensor of claim 12, further comprising means for determining the birefringence $\Gamma$ for each of the three components of the electric field by determining the ratio of the difference and sum of the intensities of the two polarizations in accordance with:

$$\Gamma \sim (I_1 - I_2)/(I_1 + I_2)$$

where $I_1$ and $I_2$ are the intensities of the two polarization components of the respective beam.

14. The sensor of claim 13, further comprising means for compensating for the reduced sensitivity along the second path due to the respective crystal direction.

15. The sensor of claim 14, wherein the compensating means reflects the second beam back through the crystal so as to double the second path length and equate the sensitivity along the second path with that along the first and third paths.

16. A method of electro-optic sensing comprising:
providing a single electro-optic crystal, said crystal including three optical paths to enable detection of three orthogonal components of an applied electric field;
providing three separately polarized beams, one along each of the three paths, wherein at least two of the beams are oriented along different crystallographic directions; and
sensing any induced birefringence along each of the three paths.

17. A method for measuring an electric field comprising:
providing a single electro-optic crystal of cubic symmetry and point group $\bar{4}3$ m or 23, the crystal being a rectangular parallelpiped having sides oriented in the $<110>$, $<\bar{1}10>$ and $<001>$ directions, the sides lying in the $<110>$ and $<\bar{1}10>$ directions being of substantially equal length;
directing a substantially circularly polarized first beam down a first path in the crystal oriented in the $<\bar{1}10>$ direction;
directing a substantially circularly polarized second beam down a second path in the crystal oriented in the $<110>$ direction;
directing a substantially circularly polarized third beam down a third path in the crystal oriented in either the $<\bar{1}10>$ or $<110>$ directions, and spaced from either the first or second paths respectively;
measuring the intensities of the first beam exiting the first path at polarizations of 0° and 90° to the $<001>$ direction;

measuring the intensities of the second beam exiting the second path at polarizations of 0° and 90° to the <001> direction;

measuring the intensities of the third beam exiting the third path at polarizations of +45° and −45° to the <001> direction; and determining the magnitudes of the three components of the electric field in the <110>, <$\bar{1}$10> and <001> directions from the intensities of the two polarizations measured at the end of each of the first, second and third paths respectively.

18. The method of claim 17, wherein the birefringence $\Gamma$ for each of the components of the electric field is determined by taking the ratio of the difference and sum of the intensities of the two polarizations in accordance with:

$$\Gamma \sim (I_1 - I_2)/(I_1 + I_2)$$

where $I_1$ and $I_2$ are the intensities of the two polarization components of the relevant beam, and the electric field components $E_x$, $E_y$, $E_z$ are determined from the respective birefringence for each component in accordance with:

$$\Gamma_1 = (2\pi L_1/\lambda) r_{41} n_0^3 E_x$$

$$\Gamma_2 = (\pi L_1/\lambda) r_{41} n_0^3 E_z$$

$$\Gamma_3 = (2\pi L_3/\lambda) r_{41} n_0^3 E_y$$

where $L_1$ and $L_3$ are the lengths of the sides of the parallelepiped lying in the <$\bar{1}$10> and <110> directions respectively, $r_{41}$ is an electro-optic constant, $\lambda$ is the wavelength of the beam and $n_0$ is the zero-field refractive index.

19. The method of claim 17, wherein the sensitivity of the measurement is increased by increasing the lengths of the sides of the parallelepiped lying in the <$\bar{1}$10> and <110> directions.

* * * * *